United States Patent [19]

de Leeuw

[11] 4,171,408

[45] Oct. 16, 1979

[54] DEVICE OPERATING ON THE DISPLACEMENT OF MAGNETIC DOMAIN WALLS

[75] Inventor: Franciscus H. de Leeuw, Eindhoven, Netherlands

[73] Assignee: U.S. Philips Corporation, New York, N.Y.

[21] Appl. No.: 861,722

[22] Filed: Dec. 19, 1977

Related U.S. Application Data

[63] Continuation of Ser. No. 701,635, Jul. 1, 1976, abandoned, which is a continuation-in-part of Ser. No. 631,161, Nov. 11, 1975, abandoned.

[51] Int. Cl.² ............................................. H01F 10/02
[52] U.S. Cl. .................................. 428/539; 427/131; 428/900
[58] Field of Search ............................. 427/127–132, 427/48; 428/539, 900

[56] References Cited

U.S. PATENT DOCUMENTS 3,714,640  1/1973  Bobeck .......................... 340/174 TF

*Primary Examiner*—Bernard D. Pianalto

[57] ABSTRACT

In a device operating on the displacement of magnetic domain walls and comprising a layer of magnetizable material having an easy axis of magnetization normal to the plane of the layer, in which layer magnetic domain walls exist, the presence in the walls of an internal magnetic field directed parallel to the plane of the layer ensures that the walls can be displaced with higher velocity. Said internal field is created by providing on the first layer a second layer of magnetizable material having an easy axis of magnetization normal to the plane of the layer, the saturation magnetization of the second layer being higher than that of the first layer.

5 Claims, 3 Drawing Figures

DEVICE OPERATING ON THE DISPLACEMENT OF MAGNETIC DOMAIN WALLS

This is a continuation, of application Ser. No. 701,635, filed July 1, 1976, which is a continuation-in-part of application, Ser. No. 631,161, filed Nov. 11, 1975, now abandoned.

The invention relates to a device operating on the displacement of magnetic domain walls and comprising a first layer of magnetisable material having an easy axis of magnetisation normal to the plane of the layer, in which layer magnetic domain walls exist, the layer having a plurality of fixed positions for the domain walls as well as displacement means for moving magnetic domain walls between previously determined positions.

A field of application for devices of this kind are, for example, data handling systems, notably devices in which magnetisable media through which magnetic domain walls can be moved are used for the performance of logic, display and memory functions. In this connection it is to be noted that both straight domain walls and, for example, domain walls which are closed in themselves and which form the boundary of so-called magnetic "bubbles" are to be included.

From the publication "Magnetic bubbles a Technology in the making," Electronics, September, 1969, pp. 83–89, for example, devices are known in which thin films of magnetisable material are used having an easy axis of magnetisation normal to the plane of the film, in which films magnetic "bubble" domains, i.e. magnetic domains which are bounded by a wall closed in itself and can assume the shape of a cylinder are created. A bias magnetisation field is generated having such a strength and polarity that the individual domains can be maintained and be moved as stable units.

The displacement of both straight domain walls and of domain walls closed in themselves from one position to the other can be carried out by means of localized magnetic fields.

A controlled movement of domain walls is possible by means of a pattern of electric conductors to which currents are applied in such manner that the wall is moved along a previously determined track successively from one point to the other.

Another possibility for a controlled movement of domain walls consists of in the use of a pattern of permalloy elements which have such a shape that, together with a rotating magnetic field which can be generated by means of electric windings arranged around the above-mentioned device, they force the domains to displace in a given direction.

It is a requirement in particular for use in data handling systems that the displacement velocity of the magnetic domain walls be so high that the same bit-rates can be realized as are achieved with other data handling systems.

In this connection it is known from the publication "Influence of an In-Plane Magnetic Field on the Domain Wall Velocity in Ga:YIG Films" in IEEE Transactions on Magnetics, Vol.-Mag.-9, No. 4, December, 1973 to cause an external magnetic field to act upon a layer of magnetisable material in which a straight domain wall exists, said field having a field direction which lies in the plane of the layer. It has been found that by applying such a field a considerably higher velocity of the domain wall is possible than when said field is not present. This phenomenon also occurs in walls which are closed in themselves and which form the boundary of "bubble" domains.

However, a drawback of the use of said external magnetic field is that in displacement devices in which patterns of soft magnetic material (for example, nickel-iron alloys) are used for controlling the domain walls, the soft magnetic material may become saturated so that said devices no longer operate as they should. In addition, external means which render the device complicated are necessary for generating the external magnetic field.

It is an object of the present invention to increase the velocity with which domain walls can be displaced in a device of the kind mentioned in the preamble without the application of an external magnetic field being a priori necessary for that purpose.

Therefore, the device according to the invention is characterized in that an internal magnetic field directed parallel to the plane of the layer is present in the domain walls.

The strength of the internal field (in Oersteds) throughout the height of the first layer is preferably at least equal to eight times the prevailing magnetisation of the layer outside the wall (in Gauss).

Such an internal field which has the same effect as the above-mentioned external field can be generated in various manners without therefore requiring external means which might disturb the operation of the soft magnetic patterns.

An internal field in a domain wall may be the result of a non-homogeneous distribution of the magnetisation in the wall in the direction of height of the magnetisable layer.

Within the scope of the present invention, a non-homogeneous distribution can be realized in that at least one side of the first layer is in direct contact with a second layer of magnetisable material having an easy axis of magnetisation normal to the plane of the second layer, the magnetisation of the second layer differing from that of the first layer.

According to a preferred embodiment of the device according to the invention, the non-homogeneity of the distribution of the magnetisation can be increased and hence the internal field be strengthened when the first layer is present between and in direct contact with two layers of magnetisable material each having an easy axis of magnetisation normal to its plane, the magnetisation of one layer being higher than that of the first layer and the magnetisation of the other layer being lower than that of the first layer.

According to a further preferred embodiment of the device according to the invention, a practical embodiment of the above-mentioned construction is characterized in that the first layer is grown by liquid phase epitazy on a substrate of non-magnetisable material and that a second layer of magnetisable material having an easy axis of magnetisation normal to the plane of the layer is grown on the free side of the first layer, the magnetisation of the second layer being higher than that of the first layer.

The measures according to the invention are of particular importance when the domain walls exist in layers having an iron garnet composition. In the already mentioned article in IEEE Transactions on Magnetics it is described that garnet materials are affected with the property that there is a small range of values of the driving field (the so-called operating region) for which the velocity of the wall is proportional to the applied driving field. Above a certain value of the driving field the wall velocity decreases and assumes a substantially constant value which is independent of a further increase of the driving field. This phenomenon restricts the maximum achievable velocity in garnet materials. The increase in wall velocity which is necessary just in these materials can be realized in a simple manner with the device according to the invention.

The magnetisation of iron garnet material can be adjusted by substituting it with more or less gallium. The higher the gallium content, the lower is the magnetisation. A further preferred embodiment of the device according to the invention is characterized in that the first layer consists of gallium-substituted yttrium-iron garnet, the second layer consisting of gallium-substituted yttrium-iron garnet having a lower gallium content than the first layer.

The invention will be described in greater detail, by way of example, with reference to the drawing, in which.

In the Figures corresponding components are referred to by the same reference numberals.

Figure 1:
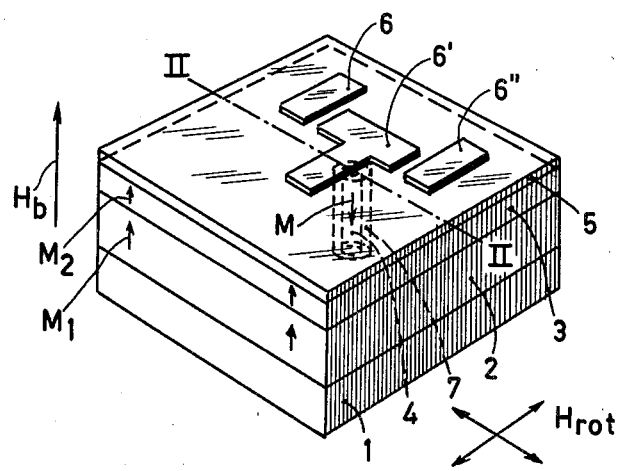
FIG. 1 shows diagrammatically a device for displacing domain walls.

Reference numeral 1 in FIG. 1 denotes a non-magnetisable (111) substrate crystal of the composition ($Gd_3Ga_5O_{12}$). On said crystal is grown by means of liquid phase epitaxy a layer 2 of magnetisable material of the composition $Y_{2.9}La_{0.1}Fe_{3.8}Ga_{1.2}O_{12}$. On the starting layer 2 a layer 3 is grown of the composition $Y_{2.9}La_{0.1}Fe_{4.0}Ga_{1.0}O_{12}$.

Under the influence of the bias field $H_b$ (which is generated by means not shown) a single-wall magnetic domain 4 exists in the layer 2 and continues in the layer 3. The magnetisation of the layer 2 is denoted by the arrow $M_1$, the magnetisation of layer 3 which is larger than that of the layer 2 is denoted by the arrow $M_2$, and the magnetisation within the single-walled domain 4 the direction of which is opposite to that of the bias field $H_b$ is denoted by the arrow M.

The domain 4 is bounded by the domain wall 7. The assembly can be displaced by means of a rotating magnetic field $H_{rot}$ which is generated by means of windings (not shown) arranged around the structure of layers and which induces poles in the T and I-shaped structures 6, 6' and 6" of nickel-iron which are provided on the separating layer 5.

Figure 2:
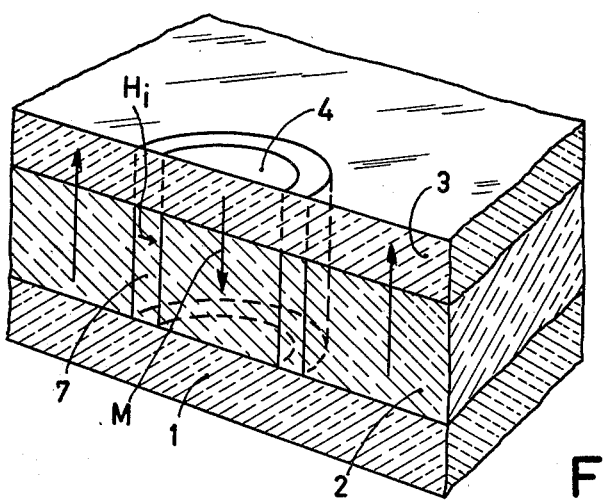
FIG. 2 is a sectional view of a part of the device shown in FIG. 1.

A sectional view of a part of the structure of layers of FIG. 1 is shown in FIG. 2. This sectional view has been taken on the line II—II. As a result of the provision of the layer 3 on the layer 2, an internal field $H_i$ is present in the wall 7 of the domain 4 which is the result of a non-homogeneous magnetization in the wall in the direction of height of the layer.

In the triple layer construction shown in FIG. 2, the outer layers 2 and 3 may have anisotropies differing in sign, i.e. layer 2 may have a positive anisotropy and layer 3 may have a negative anisotropy.

Figure 3:
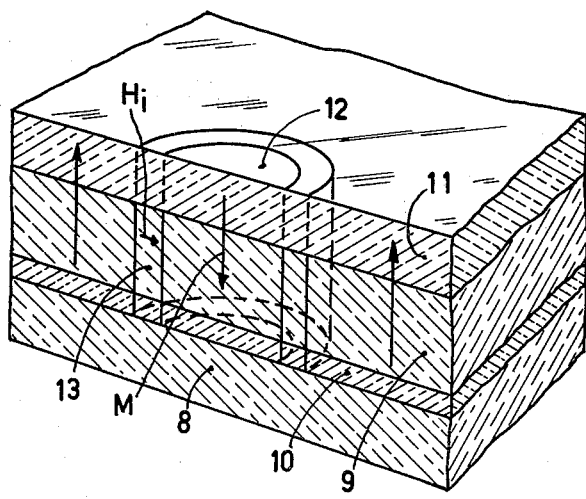
FIG. 3 is a sectional view of a part of another embodiment according to the invention.

Likewise, the device may comprise three layers, as shown in FIG. 3, in which the intermediate layer 9 has a positive anisotropy and is bounded by layers 10 and 11 which have a negative anisotropy, an internal field $H_i$ being present in the wall 13 of domain 12 which is the result of a non-homogeneous magnetization in the wall in the direction of height of the layer.

Internal fields $H_i$ having a strength of a few tens of Oersteds have been achieved in this manner, which resulted in an increase of the wall velocity with a given drive field by approximately a factor two.

What is claimed is:

1. A device operating by displacement of magnetic domain walls comprising a first layer of magnetic monocrystalline garnet, said layer having an easy axis of magnetization normal to said layer, means to generate magnetic domain walls in said layer, said layer having a plurality of fixed positions for the domain walls, a second layer of magnetic monocrystalline garnet in direct contact with said first layer, said second layer having an easy axis of magnetization normal to the plane of the second layer and a magnetization differing from that of said first layer, whereby a non-homogeneous distribution of the magnetization in the domain walls in the direction of height is produced which results in an internal field directed parallel to the plane of the first layer being present which enhances the propagation velocity of the domain walls, and displacement means for moving magnetic domain walls between previously determined positions.

2. A device as claimed in claim 1, wherein the strength of the internal field (expressed in Oersteds) throughout the height of the first layer is at least equal to eight times the prevailing magnetisation of the layer outside the wall (expressed in Gauss).

3. A device as claimed in claim 1 in which the first layer is a gallium substituted yttrium iron garnet and is disposed on a substrate, and the second layer is a gallium substituted yttrium iron garnet having a lower gallium content than that of the first layer and is disposed on top of the first layer.

4. A device operating by displacement of magnetic domain walls comprising a first layer of magnetic monocrystalline garnet, said first layer having an easy axis of magnetization normal to said layer, means to generate magnetic domain walls in said layer, said layer having a plurality of fixed positions for the domain walls, a second layer of magnetic monocrystalline garnet in direct contact with said first layer, said second layer having an easy axis of magnetization normal to the plane of the second layer and a magnetization differing from that of said first layer, a third layer of magnetic monocrystalline garnet in direct contact with said first layer, said third layer having an easy axis of magnetization normal to the plane of the third layer and a magnetization differing from that of said first layer and that of said second layer, whereby a non-homogeneous distribution of the magnetization in the domain walls in the direction of height is produced which results in an internal field directed parallel to the plane of the first layer being present which enhances the propagation velocity of the domain walls, and displacement means for moving magnetic domain walls between previously determined positions.

5. A device as claimed in claim 4 in which the first layer is between the second and third layers, and in which the magnetization of the second layer is higher than that of the first layer and the magnetization of the third layer is lower than that of the first layer.

* * * * *